(12) United States Patent
Fumitake

(10) Patent No.: US 8,883,585 B1
(45) Date of Patent: Nov. 11, 2014

(54) FIN FIELD-EFFECT TRANSISTORS AND FABRICATION METHOD THEREOF

(71) Applicant: Semiconductor Manufacturing International (Shanghai) Corporation, Shanghai (CN)

(72) Inventor: Mieno Fumitake, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/078,655

(22) Filed: Nov. 13, 2013

(30) Foreign Application Priority Data

Jun. 26, 2013 (CN) .......................... 2013 1 0259904

(51) Int. Cl.
*H01L 21/336* (2006.01)
*H01L 29/78* (2006.01)
*H01L 29/66* (2006.01)

(52) U.S. Cl.
CPC ........ *H01L 29/66795* (2013.01); *H01L 29/785* (2013.01)
USPC ......................... 438/197; 438/637; 257/E21.4

(58) Field of Classification Search
USPC ....................................... 257/E21.014, E21.4
See application file for complete search history.

(56) References Cited

U.S. PATENT DOCUMENTS

2012/0049281 A1* 3/2012 Tsuchiya et al. .............. 257/347

* cited by examiner

*Primary Examiner* — Cheung Lee
(74) *Attorney, Agent, or Firm* — Anova Law Group, PLLC

(57) ABSTRACT

A method is provided for fabricating a fin field-effect transistor. The method includes providing a semiconductor substrate having one or more first fins and second fins; and forming a first doping layer covering the first fins and the second fins. The method also includes forming an isolation layer to isolate adjacent fins; and forming a gate structure stretching across top and sidewalls of the first fins. Further, the method includes forming a source region and a drain region in the fins at both sides of the gate structure; and forming a dielectric layer on the isolation layer. Further, the method also includes forming a first through hole in the dielectric layer to expose a portion of the first doping layer on a top of the second fins; and forming a first conductive via in the first through hole to connect with a bias control voltage.

20 Claims, 5 Drawing Sheets

FIN FIELD-EFFECT TRANSISTORS AND FABRICATION METHOD THEREOF

CROSS-REFERENCES TO RELATED APPLICATIONS

This application claims the priority of Chinese patent application No. 201310259904.1, filed on Jun. 26, 2013, the entirety of which is incorporated herein by reference.

FIELD OF THE INVENTION

The present invention generally relates to the field of semiconductor manufacturing technology and, more particularly, relates to fin field-effect transistors and fabrication techniques thereof.

BACKGROUND

With the development of the semiconductor manufacturing technology, technical nodes have consistently decreased, thus a gate-last process has been widely used to obtain an ideal threshold voltage to improve the device performance. However, when the critical dimension (CD) is further reduced, the structures of conventional MOS field effect transistors (MOSFETs) are unable to match requirements of the device performance even the gate-last process is used to form MOSFETs. Fin field-effect transistors (FinFET) have attracted extensive attentions because they may substitute the conventional devices.

FIG. 1 illustrates an existing FinFET. As show in FIG. 1, the FinFET includes a semiconductor substrate 10 and a protruding fin 14 on the semiconductor substrate 10. The fin 14 may be formed by etching the semiconductor substrate 10. The FinFET also includes a plurality of insulation structures 11 covering a surface of the semiconductor substrate 10 and a portion of side surfaces of the fin 14 and a gate structure 12 stretching across the fin 14; and covering the top and side surfaces of the fin 14. The gate structure 12 includes a gate dielectric layer 13 and the gate electrode 15 on the gate dielectric layer 13.

When the FinFET is used, a bias control voltage may be applied on the semiconductor substrate 10 to adjusting the threshold voltage of the FinFET. However, it may be difficult to use such method to adjust the threshold voltage of the FinFET. The disclosed device structures and methods are directed to solve one or more problems set forth above and other problems.

BRIEF SUMMARY OF THE DISCLOSURE

One aspect of the present disclosure includes a method for fabricating a fin field-effect transistor. The method includes providing a semiconductor substrate having one or more first fins and second fins; and forming a first doping layer covering the first fins and the second fins. The method also includes forming an isolation layer to isolate adjacent fins; and forming a gate structure stretch across top and sidewalls of the first fins. Further, the method includes forming a source region and a drain region in the fins at both sides of the gate structure; and forming a dielectric layer on the isolation layer. Further, the method also includes forming a first through hole in the dielectric layer to expose a portion of the first doping layer on a top of the second fins; and forming a first conductive via in the first through hole to connect with a bias control voltage.

Another aspect of the present disclosure includes a fin field-effect transistor. The fin field-effect transistor includes a semiconductor substrate having one or more first fins and one or more second fins and a first doping layer covering the first fins, the second fins and the semiconductor substrate. The fin field-effect transistor also includes an isolation layer on the first doping layer with a surface of the isolation layer lower than a surface of the first doping layer on the top of the first fins and the second fins and a gate structure stretching over the first fins on the first doping layer. Further, the fin field-effect transistor includes a source region and a drain region in each of the first fins at both sides of the gate structure and a dielectric layer on the isolation layer covering the gate structure and the first doping layer. Further, the fin field-effect transistor also includes a first conductive via connecting with second fin in the dielectric layer configured to connect with a bias control voltage.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
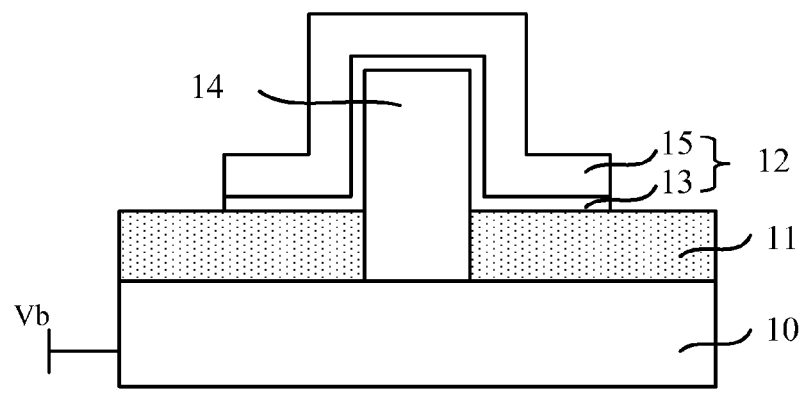
FIG. 1 illustrates an existing fin field-effect transistor.

Referring to FIG. 1, when the threshold voltage of the FinFET is adjusted, the substrate 10 may often be connected with a bias voltage $V_b$. The bias voltage $V_b$ may need to go through the semiconductor substrate 10 and the fin 14 to transfer to a vicinity of the surface of the fin 14 on the bottom of the gate structure 12, thus a transfer path of the bias voltage $V_b$ may be significantly long; and a resistance of along the transfer path may be relatively large. Therefore, the potential on the surface of the fin 14 on the bottom of the gate structure 12 applied by the bias voltage $V_b$ may be substantially small. The small potential may adverse to adjusting the threshold voltage of the FinFET; and the bias voltage $V_b$ may have a relatively weak adjusting ability to the threshold voltage.

In order to increase the adjusting ability of the bias voltage $V_b$ to the threshold voltage, one method is to increase doping concentrations of the semiconductor substrate 10 and the fin 14. However, such a method may significantly affect electric properties of the FinFET. Another method is to increase the bias voltage $V_b$, but power consumption of the FinFET may be increased. These issues may be overcomes by using a first doping layer to reduce the transfer path.

Figure 10:
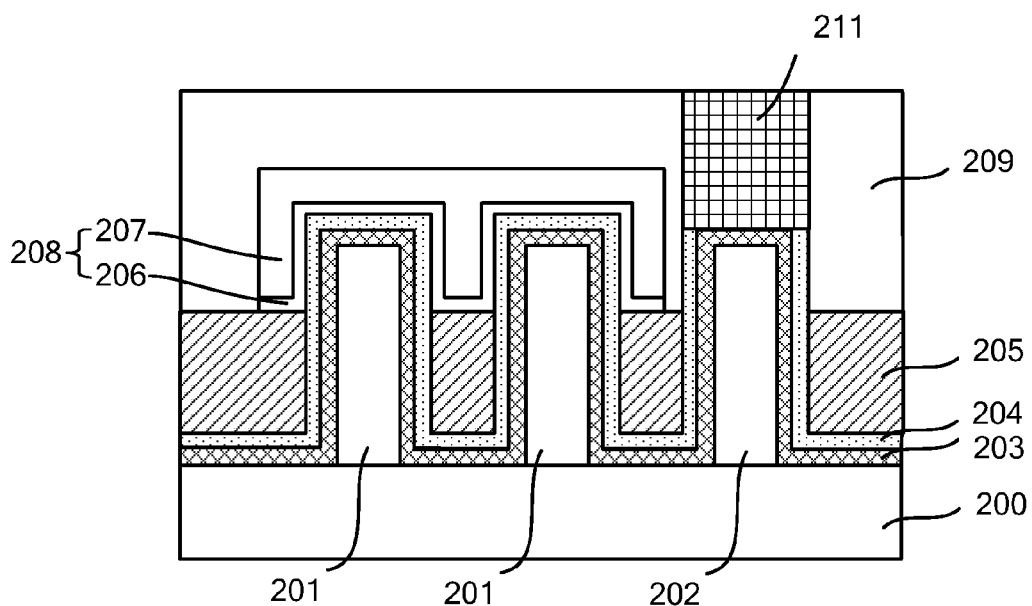
Figure 11:
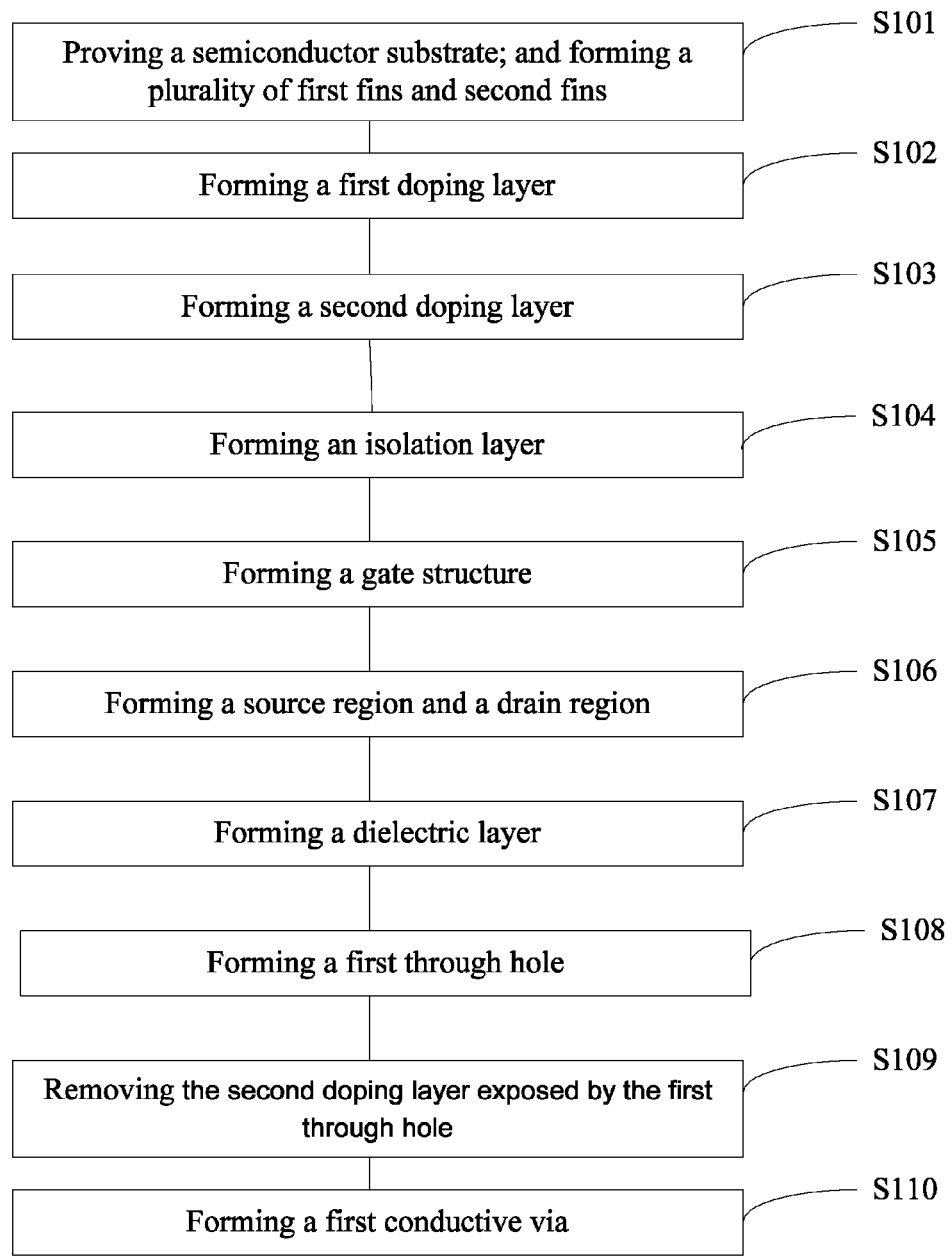
FIG. 11 illustrates an exemplary fabrication process of a fin field-effect transistor consistent with the disclosed embodiments.

FIG. 11 illustrates an exemplary fabrication process of a fin field-effect transistor (FinFET); and FIGS. 2~10 illustrate exemplary semiconductor structures corresponding to various stages of the fabrication process.

Figure 2:
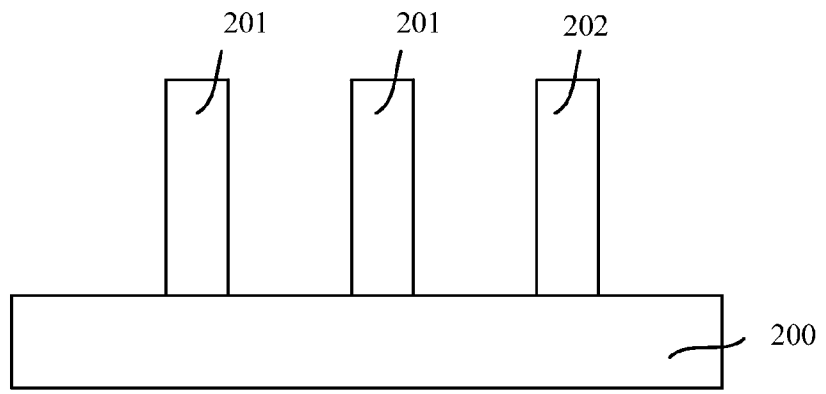
FIGS. 2~10 illustrate semiconductor structures corresponding to certain stages of an exemplary fabrication process of a fin field-effect transistor consistent with the disclosed embodiments.

As shown in FIG. 11, at the beginning of the fabrication process, a semiconductor substrate with certain structures is provided (S101). FIG. 2 illustrates a corresponding semiconductor structure.

As shown in FIG. 2, a semiconductor substrate 200 is provided. The substrate 200 may have a plurality of discrete first fins 201 and second fins 202 on one surface. A number of the first fins 201 may be greater than one. A number of the second fins 202 may be at least one. For illustrative purposes, two first fins 201 and one second fin 202 are used for descriptions. The two first fins 201 may be used as two fins of a multiple-FinFET; and a gate structure may be subsequently formed on both of the two first fins 201. That is, the gate structure may stretch over both of the two fins.

The semiconductor substrate 200 may include any appropriate semiconductor materials, such as silicon, silicon on insulator (SOI), silicon germanium, carborundum, indium antimonide, lead telluride, indium arsenide, indium phosphide, gallium arsenidie, gallium antimonite, alloy semiconductor or a combination thereof. In one embodiment, the semiconductor substrate is silicon. The substrate 200 provides a base for subsequent processes and structures.

The first fins 201 may be used as fins of subsequently formed FinFETs. The second fin 202 may be used as a dummy fin to subsequently form a first doping layer. The first fins 201 and the second fin 202 may be formed by a same process. The first fins 201 and the second fin 202 may also be formed independently. The second fin 202 may cause a subsequent process for forming an isolation layer and conductive vias to be compatible with a process for forming the FinFETs.

The first fins 201 and the second fin 202 may be formed by etching the semiconductor substrate 200. The first fins 201 and the second fin 202 may also be formed directly by depositing a semiconductor material on the semiconductor substrate 200 using a shadow mask having patterns of the plurality of fins 201 and the second fin 202. In certain other embodiments, the first fins 201 and the second fin 202 may be formed by an epitaxial growth process. The fins 201 and the fin 202 may be made of a same material as the semiconductor substrate 200, or a different semiconductor material including one or more of silicon, silicon germanium, carborundum, indium antimonide, lead telluride, indium arsenide, indium phosphide, gallium arsenidie, gallium antimonite, or alloy semiconductor, etc.

The first fins 201 may be doped with different types of ions according to subsequently formed FinFETs. When the FinFETs are P-type FinFETs, the first fins 201 may be doped with N-type ions. When the FinFETs are N-type FinFETs, the first fins 201 may be doped with P-type ions. The second fin 202 may be doped with a certain type ions, or may not be doped.

Figure 3:
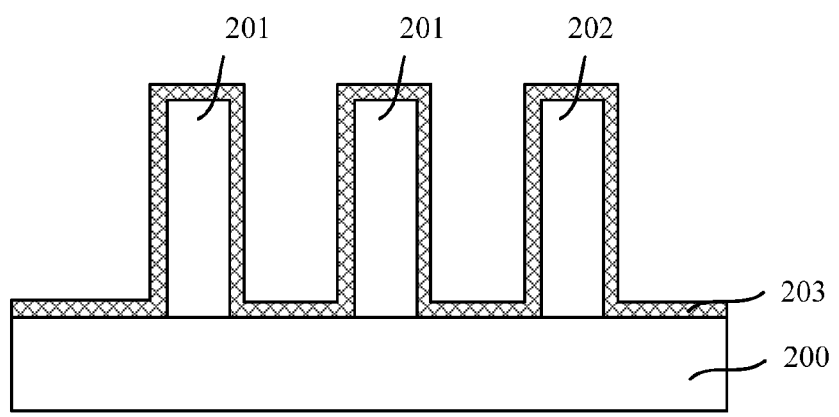

Returning to FIG. 11, after forming the first fins 201 and the second fin 202, a first doping layer may be formed on the first fins 201, the second fin 202 and the surface of the semiconductor substrate 200 (S102). FIG. 3 illustrates a corresponding semiconductor structure.

As shown in FIG. 3, a first doping layer 203 is formed on the first fins 201, the second fin 202 and the surface of the semiconductor substrate 200. That is, the first doping layer 203 covers surfaces of the first fins 201, the second fin 202 and the surface of the semiconductor substrate 200.

The first doping layer 203 may subsequently be used as a transfer path of a bias voltage. A doping concentration of the first doping layer 203 may be relatively high. For example, the doping concentration of the first doping layer 203 may be in a range of approximately 1E18 atom/m$^3$~1E19 atom/cm$^3$. Such a concentration may reduce a "turn-on" resistance of the first doping layer 203. The doping concentration of the first doping layer 203 may be greater than a doping concentration of the first fins 201.

Further, a thickness of the first doping layer 203 may be relatively small. For example, the thickness of the first doping layer 203 may be in a range of approximately 1 nm~3 nm. Such a small thickness may unlikely lessen, or weakly lessen an adjusting ability of a subsequently formed gate structure to the fins 201.

The first doping layer 203 may be made of any appropriate semiconductor material doped with a certain type of ions, such as ploy silicon, doped silicon carbide, or doped silicon germanium, etc. Thus, the first doping layer 203 may not only be used as a transfer path of the bias voltage, a portion of the conductive channel of the FinFET may also be formed in the first doping layer 203. In one embodiment, the first doping layer 203 is made of poly silicon.

In certain other embodiments, the first doping layer 203 is made of doped silicon carbide, or doped silicon germanium. By selecting doping types and shapes of the first doping layer 203 according to a type of the FinFET, the carrier mobility of the conductive channel of the FinFET may be increased. Specifically, when the FinFET is a P-type FinFET, the first doping layer 203 may be made of silicon germanium. When the FinFET is an N-type FinFET, the first doping layer 203 may be made of silicon carbide.

The first doping layer 203 may have a same doping type with the first fins 201, thus a portion of the conductive channel of a FinFET may be formed in the first doping layer 203. Specifically, when the FinFET is a P-type FinFET, the first fins 201 may be doped with N-type ions. Correspondingly, the first doping layer 203 is also doped with N-types ions, such as one or more of phosphors ions, arsenic ions and antimony ions, etc. When the FinFET is an N-type FinFET, the first fins 201 may be doped with P-type ions. Correspondingly, the first doping layer 203 is also doped with P-type ions, such as one or more of boron ions, gallium ions, and indium ions, etc.

In certain other embodiments, the first doping layer 203 may be doped with a different type of ions with the first fin 201. The first doping layer 203 may still be able to adjust the threshold voltage of the FinFET.

Various processes may be used to forming the first doping layer 203, such as a chemical vapor deposition (CVD) process, a physical vapor deposition (PVD) process, an atomic layer deposition (ALD) process, a selective epitaxial process or a flowable chemical vapor deposition (FCVD) process, etc. In one embodiment, the first doping layer 203 is formed by an in situ selective epitaxial process. A temperature of the situ selective epitaxial process may be in a range of approximately 600° C.~1100° C. A pressure of the situ selective epitaxial process may be in a range of approximately 1 Torr~500 Torr. A silicon gas source may be SiH$_4$ or dichlorosilane (DCS). A germanium gas source may be GeH$_4$, etc. A selective gas may be HCl or Cl$_2$, etc. A carrier gas may be H$_2$, N$_2$ or Ar, etc. A doping gas may be B$_2$H$_6$, PH$_3$ or AsH$_3$, etc. Flow of the silicon source, the germanium source and the selective gas may be same; and the flow may be in a range of approximately 1 sccm~1000 sccm. A flow of the carrier gas may be in a range of approximately 0.1 slm~50 slm.

Optionally and additionally, a portion of the first doping layer 203 on the semiconductor substrate 200 but not connecting with the first fins 201 and the second fin 202 may be removed. Various processes may be used to remove the portion of the first doping layer 203, such as a dry etching process, a wet etching process or an ion bean etching process, etc.

Figure 4:
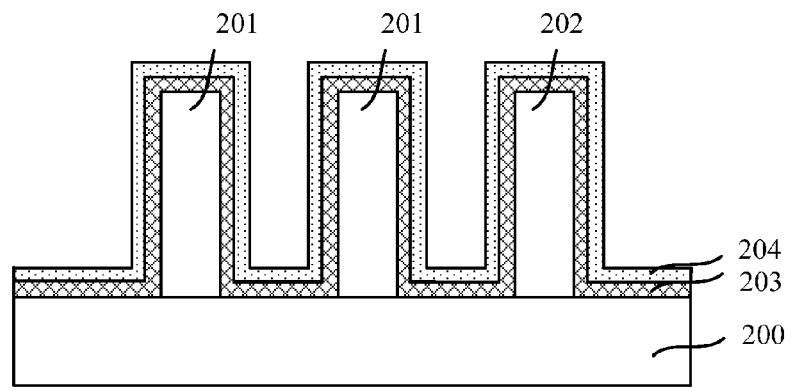

Returning to FIG. 11, after forming the first doping layer 203, a second doping layer may be formed on the first doping layer 203 (S103). FIG. 4 illustrates a corresponding semiconductor structure.

As shown in FIG. 4, a second doping layer 204 is formed on the first doping layer 203. A doping concentration of the second doping layer 204 may be smaller than the doping concentration of the first doping layer 203. The first doping layer 203 with a high doping concentration and the second doping layer 204 with a low doping concentration may be referred as a delta doped layer.

The second doping layer 204 may be used as a transitive layer between the first doping layer 203 and a subsequently formed gate structure. The doping concentration of the second doping layer 204 is smaller than the concentration of the first doping layer 203, a leakage current between the first doping layer 203 and the gate structure may be prevented. Further the second doping layer 204 may be made of a same material as the first doping layer 203; a doping type of the second doping layer 204 may be same as the doping type of the first doping layer 203; and a portion of the channel region of the FinFET may be formed in the second doping layer 204, thus the existence of the first doping layer 203 and the second doping layer 204 may unlikely affect to turn on the FinFET.

In certain other embodiments, the second doping layer 204 may be made of a material different from the first doping layer 203. The doping type of the second doping layer 204 may also be different from the doping type of the first doping layer 203.

The second doping layer 204 may be made of any appropriate material, such as poly silicon, doped silicon carbide or doped silicon germanium, etc. The doping type of the second doping layer 204 may be N-type or P-type. Various processes may be used to form the second doping layer 204, such as a PVD process, a CVD process, an FCVD process, an ALD process, or a selective epitaxial process, etc. In one embodiment, the second doping layer is formed by an in situ epitaxial process.

A thickness of the second doping layer 204 may be equal to, or smaller than the thickness of the first doping layer 203. In one embodiment, the thickness of the second doping layer 204 may be in a range of approximately 0.5 nm~3 nm. The doping concentration of the second doping layer 204 may be in a range of approximately $5E16$ atom/cm$^3$~$5E18$ atom/cm$^3$. In certain other embodiments, the thickness of the second doping layer 204 may be greater than the thickness of the first doping layer 203.

Optionally and additionally, a portion of the second doping layer 204 on the semiconductor substrate 200 and the second fin 202 may be removed; and a portion of the second doping layer 204 on sidewalls of the first fins 201 may be kept.

In certain other embodiments, the second doping layer 204 may be omitted.

Optionally and additionally, an intrinsic layer (not shown) may be formed on the second doping layer 204. The intrinsic layer may have no dopant. A thickness of the intrinsic layer may be in a range of approximately 0.5 nm~3 nm.

Figure 5:
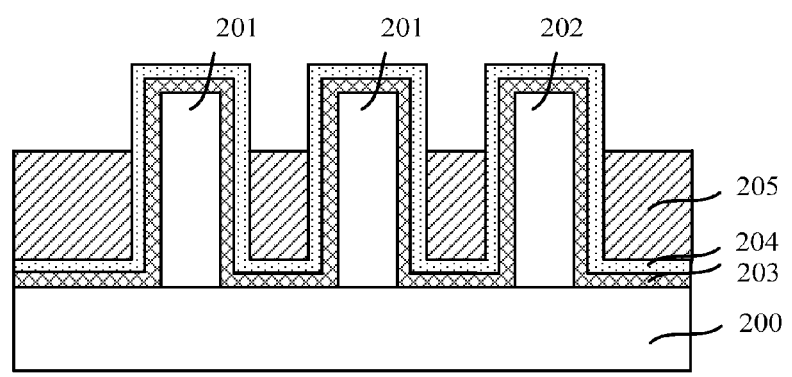

Returning to FIG. 11, after forming the second doping layer 204, an isolation layer may be formed (S104). FIG. 5 illustrates a corresponding semiconductor structure.

As shown in FIG. 5, an isolation structure 205 is formed on the second doping layer 204, a surface of the isolation structure may be lower than a surface of the second doping layer 204 on the top of the first fins 201 and the second fin 202.

The isolation layer 205 may be used to isolate adjacent fins including adjacent first fins 201, adjacent second fins 201, and the first fin 201 and the second fin 202 shown in FIG. 5. The isolation layer 205 may also be used to isolate a subsequently formed gate structure and the first doping layer 203 and the second doping layer 204 on the semiconductor substrate 200.

The isolation layer 205 may be made of any appropriate material, such as silicon oxide, silicon nitride or silicon oxynitride, etc. In one embodiment, the isolation layer 205 is made of silicon oxide. A process for forming the isolation structure 205 may include forming an isolation material layer on the second doping layer 204 (covering the second doping layer 204); planarizing the isolation material layer to make a surface of the isolation material layer to level with the surface of the second doping layer 204 on the first fins 201 and the second fin 202; and etching back the isolation material layer to cause the surface of the isolation material layer to be lower than the surface of the second doping layer 204 on the top surfaces of the first fins 201 and the second fin 202.

Various processes may be used to form the isolation material layer, such as a CVD process, a PVD process, an ALD process, an FCVD process or an epitaxial growth process, etc. The planarization process may include a chemical mechanical polishing (CMP) process, a mechanical process, or an ion beam sputter process, etc. The etch back process may include a dry etching process, a wet etching process or an ion bean etching process, etc.

Figure 6:
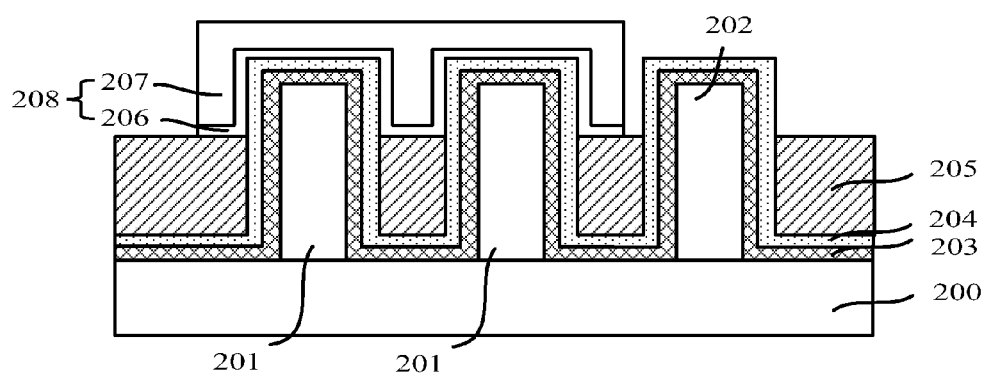

Returning to FIG. 11, after forming the isolation structure 205, a gate structure may be formed on the sidewalls and the top of the first fins 201 (S105). FIG. 6 illustrates a corresponding semiconductor structure.

As shown in FIG. 6, a gate structure 208 is formed on the sidewalls and the top of the first fins 201. That is, the gate structure 208 stretches across the first fins 201. The gate structure 208 may also cover the second doping layer 204 on the top portion of the sidewalls of the first fins 201 and the top of the first fin 201.

The gate structure 208 may include a gate dielectric layer 206 and a gate 207 on the gate dielectric layer 206. The gate structure 208 may also include sidewall spacers on sidewalls of the gate dielectric layer 206 and the gate 207.

In one embodiment, the gate structure 208 may be a metal gate structure. That is, the gate dielectric layer 206 may be a high dielectric constant (high-K) material; and the gate 207 may be a metal gate. The gate dielectric layer 206 may be made of any appropriate material, such as one or more of $HfO_2$, HfSiO, HfSiON, HfTaO, $Al_2O_3$ and $ZrO_2$, etc. The metal gate may be made of any appropriate material, such as Al, Cu or Ti.

In certain other embodiments, the metal gate structure 208 may also be a poly silicon gate structure. The gate dielectric layer 206 may be silicon oxide; and the gate 207 may be poly silicon.

Various processes may be used to form the metal gate structure 208. In one embodiment, the metal gate structure 208 is made by a gate-last process. The details of the gate-last process for forming the metal gate structure is omitted here.

After forming the gate structure 208, a source region and a drain region (not shown) may be formed in each of the first fins 201 at both sides of the gate structure 208 (S106). Various processes may be used to form the source region and the drain region, such as an ion implantation process or an embedding process, etc.

Figure 7:
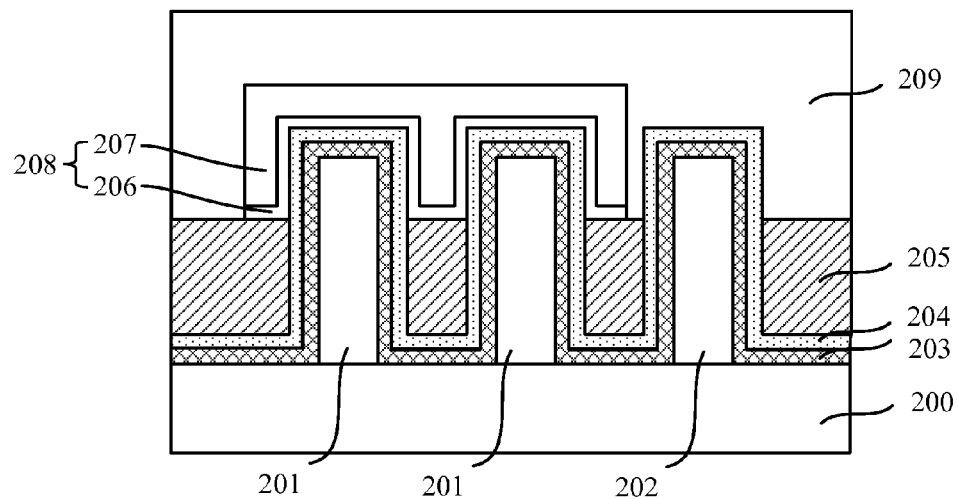

Returning to FIG. 11, after forming the source region and the drain region, a dielectric layer may be formed (S107). FIG. 7 illustrates a corresponding semiconductor structure.

As shown in FIG. 7, a dielectric layer 209 is formed on the isolation layer 205. The dielectric layer 209 may also cover the gate structure 208 and the second doping layer 204. Further, a top surface of the dielectric layer 209 may be higher than a top surface of the gate structure 208.

The dielectric layer 209 may be made of any appropriate material, such as silicon oxide, silicon nitride, silicon oxynitride or low dielectric constant (low-K) materials, etc. Various processes may be used to form the dielectric layer 209, such as a CVD process, a PVD process, an ALD process or an FCVD process, etc. In one embodiment, the dielectric layer 209 is made of silicon oxide.

Figure 8:
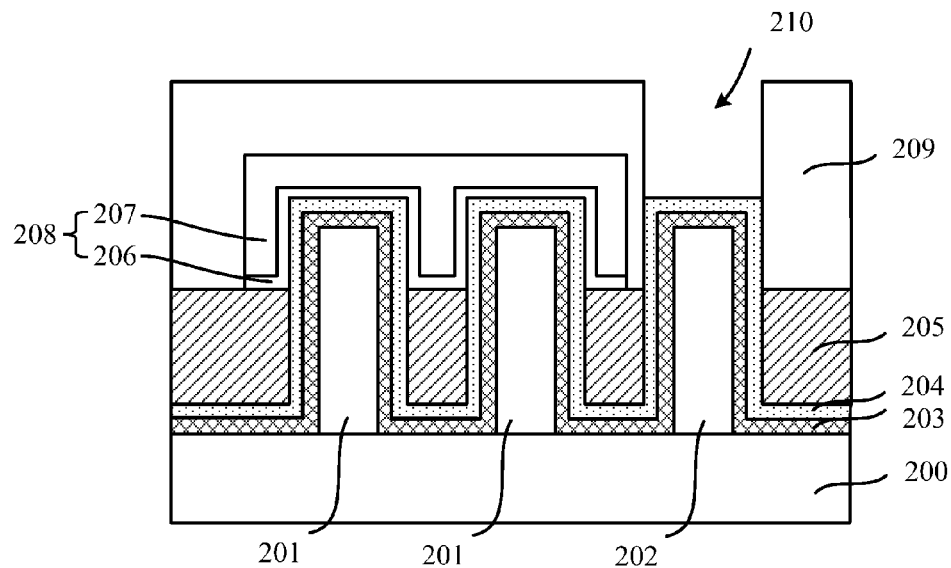
Figure 9:
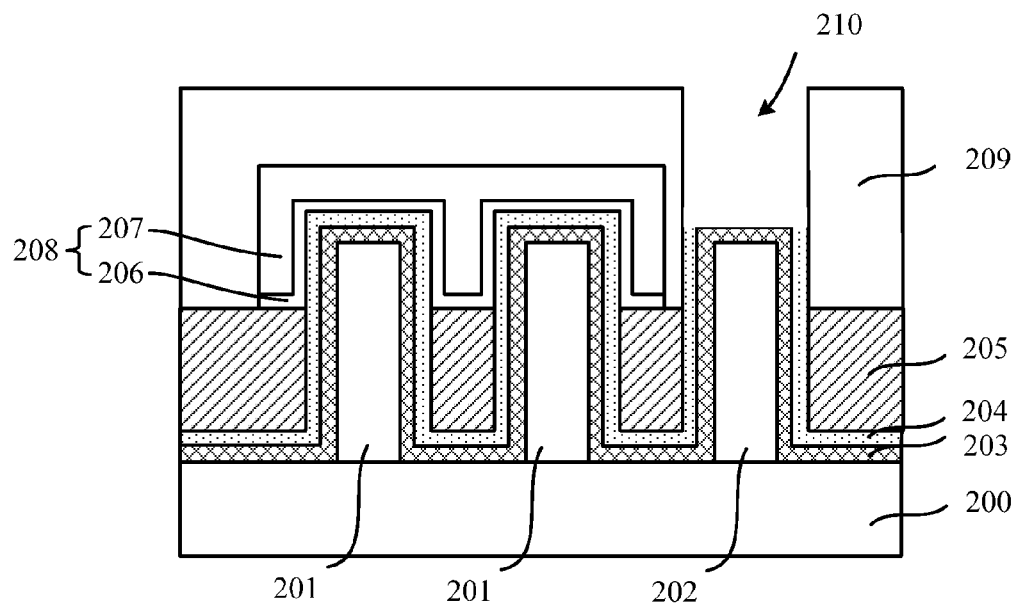

Returning to FIG. 11, after forming the dielectric layer 209, a first through hole may be formed in the dielectric layer (S108). FIG. 8 illustrates a corresponding semiconductor structure.

As shown in FIG. 8, a first through hole 210 is formed in the dielectric layer 209. The first through hole 210 may expose a top surface of the second doping layer 204 on the second fin 202. The first through hole 210 may expose the top surface of the first doping layer 203 on the second fin 202 if the second doping layer 204 is omitted. The first through hole 210 may be used to subsequently form a conductive via to connect with a bias control voltage.

Various processes may be used to form the first through hole 210, such as a dry etching process including a plasma etching process or a reactive ion etching process, etc., a wet etching process, or an ion beam etching process, etc. In one embodiment, the first through hole 210 is formed by a plasma etching process. Before the plasma etching process, a patterned photoresist layer and/or a pattered mask layer may be formed on the dielectric layer 209 to be used as an etching mask.

Further, second through holes exposing the surfaces of the gate structure 208 and third through holes exposing surfaces of the source region and the drain region may also be formed when the first through hole 201 is formed. In certain other embodiments, the second through holes and the third through holes may be formed separately.

Returning to FIG. 11, after forming the first through hole 210, the second doping layer 204 exposed by the first through hole 210 may be removed (S109). Since the doping concentration of the second doping layer 204 may be relatively low, in order to reduce a contact resistance between a subsequently formed conductive via and the first doping layer 203, the second doping layer 204 exposed by the first through hole 210 may be removed.

Various processes may be used to remove the second doping layer 204 exposed by the first through hole 210, such as a dry etching process or a wet etching process, etc. An etchant of the wet etching process may be a trimethylanilinium hydroxide (TMAH) solution or KOH solution, etc. A source gas of the dry etching process including a plasma etching process or a reactive ion etching process may be gas containing fluorine or chlorine, etc.

Because the dry etching process or the wet etching process for removing the second doping layer 204 exposed by the first through hole 210 may over etch and/or damage the first doping layer 203, in certain other embodiments, the second doping layer 204 exposed by the first through hole 210 may unnecessarily be removed, an ion implantation process may be performed onto the second doping layer 204 exposed by the first through hole 210 to increase the doping concentration of the second doping layer 204 exposed by the first through hole 210; and a resistance of the second doping layer 204 exposed by the first through hole 210 may be decreased. A doping type of the ion plantation process may be same as the doping concentration of the second doping layer 204.

In certain other embodiments, when the second doping layer 204 exposed by the first through hole 210 is not removed, a metal silicide process may be performed; and a metal silicide layer may be formed on the bottom of the first through hole 210. Such a metal silicide layer may increase an adhesion between a subsequently formed conductive via and the first doping layer 203; and decrease the contact resistance between the conductive via and the first doping layer 203.

A process for forming the metal silicide layer may include forming a metal layer on sidewalls and the bottom of the through hole 210 and the dielectric layer 209; annealing the metal layer to cause the metal layer to react with silicon in the second doping layer 204; and removing un-reacted metal layer.

The metal layer may be made of any appropriate material, such as nickel, cobalt or nickel cobalt alloy, etc. Various processes may be used to form the metal layer, such as a sputter process, or an electroplating process, etc.

Returning to FIG. 11, after forming the first through hole 210, a first contact via may be formed in the first through hole 210 (S110). FIG. 10 illustrates a corresponding semiconductor structure.

As shown in FIG. 10, a first conductive via 211 is formed in the first through hole 210. The first conductive via 211 may be used to connect with a bias control voltage. Thus, the first conductive via 211 may be referred as a bias control contact.

The first conductive via 211 may be made of any appropriate material, such as Cu, Al or W, etc. Various processes may be used to form the first conductive via 211, such as a sputter process, an FCVD process, or an electroplating process, etc.

Before forming the first conductive via 211, a diffusion barrier layer (not shown) may be formed on sidewalls of the through hole 201. The diffusion barrier layer may prevent metal in the conductive via 211 from diffusing into the dielectric layer 209.

The diffusion barrier layer may be made of any appropriate material, such Ti, TiN, Ta or TaN, etc. The diffusion barrier layer may also be a stacked layer consisting two more different materials. In one embodiment, the diffusion barrier is a Ti/TiN stacked layer or a Ta/TaN stacked layer.

Referring to FIG. 10, when the threshold voltage of a FinFET need to be adjusted, it may only need to connect the first conductive via 211 with a bias control voltage. The bias control voltage may be conducted to the vicinity of the surface of the first fins 201 under the gate structure 208 through the first doping layer 203, thus a transfer path may be relatively short, and a resistance of the transfer path may be relatively small. Such a short transfer path and the small resistance may aid to obtain a relatively small potential drop between the vicinity of the surface of the first fins 201 under the gate structure 208 and the first conductive via 211, thus a control ability of the bias voltage to the fins 201 may be relatively strong; and it may be more convenient to adjust the threshold voltage of the FinFET. Further, because the potential drop may be relatively small, a relative low control bias may be used to adjust the threshold voltage, the power consumption may be lowered.

Thus, a FinFET may be formed by the above disclosed processes and methods, and the corresponding FinFET is shown in FIG. 10. The FinFET includes a semiconductor substrate 200 having first fins 201 and the second fin 202, and an isolation layer 205 isolating adjacent fins. The FinFET also includes a first doping layer 203 and a second doping layer 204 on the first doping layer 203. Further, the FinFET includes a metal gate structure 208 having a gate dielectric layer 206 and a metal layer 207 on the gate dielectric layer 206. Further, the FinFET also includes a dielectric layer 209 and a first conductive via 211 one the top of the second fin 202 in the dielectric layer 209. Further, the FinFET also include a source region (not shown) and a drain region (not shown) in each of the second fins 201 at both sides of the metal gate structure 208. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a fin field-effect transistor, comprising:
    providing a semiconductor substrate;
    forming one or more first fins and one or more second fins on the semiconductor substrate;
    forming a first doping layer covering the first fins and the second fins;
    forming an isolation layer on the semiconductor substrate to isolate adjacent fins;
    forming a gate structure stretching across top and sidewalls of the first fins on the isolation layer;
    forming a source region and a drain region in each of the fins at both sides of the gate structure;
    forming a dielectric layer on the isolation layer and the gate structure;
    forming a first through hole in the dielectric layer to expose a portion of the first doping layer on a top of the second fins; and
    forming a first conductive via in the first through hole to connect with a bias control voltage.

2. The method according claim 1, after forming the first doping layer, further including:
    forming a second doping layer on the first doping layer.

3. The method according to claim 2, after forming the first through hole, further including:
    removing the second doping layer exposed by the first through hole to expose the first doping layer to reduce a contact resistance between the first doping layer and the first conductive via.

4. The method according to claim 2, after forming the first through hole, further including:
    performing an ion implantation process onto the second doping layer to decrease a resistance of the second doping layer to reduce a contact resistance between the first doping layer and the first conductive via.

5. The method according to claim 2, after forming the first through hole, further including:
    forming a metal silicide layer on the second doping layer to reduce a contact resistance between the first doping layer and the first conductive via.

6. The method according to claim 2, wherein:
    a doping concentration of the second doping layer is smaller than a doping concentration of the first doping layer; and
    the doping concentration of the second doping layer is in a range of approximately 5E16 atom/cm$^3$~5E18 atom/cm$^3$.

7. The method according to claim 2, wherein:
    the second doping layer is made of a same material as the first doping layer; and
    a doping type of the second doping layer is same as a doping type of the first doping layer.

8. The method according to claim 2, wherein:
    a thickness of the second doping layer is in a range of approximately 0.5 nm~3 nm.

9. The method according to claim 2, after forming the second doping layer, further including:
    forming an intrinsic layer on the second doping layer;
    a thickness of the intrinsic layer is in a range of approximately 0.5 nm~3 nm.

10. The method according to claim 2, wherein:
    the first doping layer is connected with a bias control voltage to shorten a transfer path of the bias control voltage; and
    the second doping layer is used to prevent a leaking current between the first doping layer and the gate structure.

11. The method according to claim 1, wherein:
    the first doping layer is made of poly silicon, doped silicon carbide, or doped silicon germanium.

12. The method according to claim 1, wherein:
    a doping type of the first doping layer is same as a doping type of the first fins.

13. The method according to claim 1, wherein:
    a thickness of the first doping layer is in a range of approximately 1 nm~3 nm; and
    a doping concentration of the first doping layer is in a range of approximately 1E18 atom/cm$^3$~1E19 atom/cm$^3$.

14. The method according to claim 1, wherein:
    the first doping layer is doped with one or more of boron ions, gallium ions, indium ions, phosphors ions, arsenic ions and antimony ions.

15. A fin field-effect transistor, comprising:
    a semiconductor substrate having one or more first fins and one or more second fins;
    a first doping layer covering the first fins, the second fins and the semiconductor substrate;
    an isolation layer on the first doping layer with a surface of the isolation layer lever than a surface of the first doping layer on the top of the first fins and the second fins;
    a gate structure stretching over the first fins on the first doping layer;
    a source region and a drain region in each of the first fins at both sides of the gate structure;
    a dielectric layer on the isolation layer covering the gate structure and the first doping layer; and
    a first conductive via connecting with the second fin in the dielectric layer configured to connect with a bias control voltage,
    wherein the first conductive via is formed by:
        forming a first through hole in the dielectric layer to expose the first doping layer on top of the second fin; and
        filling the first through hole with a metal material.

16. The fin field-effect transistor according to claim 15, wherein:
    a second doping layer is formed on the first doping layer; and
    an intrinsic layer is formed on the second doping layer.

17. The fin field-effect transistor according to claim 16, wherein:
    a thickness of the second doping layer is in a range of approximately 0.5 nm~3 nm; and
    a doping concentration of the second doping layer is in a range of approximately 5E16 atom/cm$^3$~5E18 atom/cm$^3$.

18. The fin field-effect transistor according to claim 16, wherein:
    a thickness of the intrinsic layer is in a range of approximately 0.5 nm~3 nm.

19. The fin field-effect transistor according to claim 15, wherein:
   a diffusing barrier layer is formed on sidewalls of the first through hole.

20. The fin field-effect transistor according to claim 15, wherein:
   a thickness of the first doping layer is in a range of approximately 1 nm~3 nm; and
   a doping concentration of the first doping layer is in a range of approximately 1E18 atom/cm$^3$~1E19 atom/cm$^3$.

* * * * *